United States Patent
Schlueter et al.

(10) Patent No.: US 7,667,545 B2
(45) Date of Patent: Feb. 23, 2010

(54) AUTOMATIC CALIBRATION LOCK LOOP CIRCUIT AND METHOD HAVING IMPROVED LOCK TIME

(75) Inventors: David M. Schlueter, Lake Villa, IL (US); Michael C. Doll, Gurnee, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 12/042,216

(22) Filed: Mar. 4, 2008

(65) Prior Publication Data

US 2009/0224838 A1  Sep. 10, 2009

(51) Int. Cl.
 *H03L 7/08* (2006.01)
 *H03L 7/085* (2006.01)
 *H03L 7/093* (2006.01)

(52) U.S. Cl. ............................ 331/14; 331/16; 331/17; 331/25

(58) Field of Classification Search .................. 331/1 A, 331/8, 14, 16–18, 25; 455/260
See application file for complete search history.

(56) References Cited

U.S. PATENT DOCUMENTS

| 5,874,863 | A | 2/1999 | Wojewoda et al. |
| 5,889,829 | A | 3/1999 | Chiao et al. |
| 6,667,642 | B1 | 12/2003 | Moyal |
| 6,731,146 | B1 | 5/2004 | Gallardo |
| 7,199,673 | B2 | 4/2007 | Erdogan |
| 2005/0277397 | A1* | 12/2005 | Christoffers et al. ........ 455/255 |

\* cited by examiner

*Primary Examiner*—David Mis
(74) *Attorney, Agent, or Firm*—Vedder Price P.C.

(57) ABSTRACT

A lock loop circuit (216) includes a precharge circuit (304), an oscillator circuit (306), and a calibration circuit (309). The calibration circuit includes at least one register (362). The precharge circuit provides a precharge signal (347). The oscillator circuit provides an output frequency signal (228) in response to a steering signal (334) that is based on the precharge signal. The calibration circuit, prior to the lock loop circuit entering a disabled mode of operation, determines a calibration value (368) for the precharge circuit based on the precharge signal and the steering signal. The calibration circuit stores the calibration value as a digital calibration value (370) in the register.

17 Claims, 5 Drawing Sheets

FIG. 1 —PRIOR ART—

AUTOMATIC CALIBRATION LOCK LOOP CIRCUIT AND METHOD HAVING IMPROVED LOCK TIME

BACKGROUND

CROSS-REFERENCE TO RELATED APPLICATION

This application is related to co-pending application entitled "LOCK LOOP CIRCUIT AND METHOD HAVING IMPROVED LOCK TIME," Ser. No. 12/042,228 filed on even date, having inventors David M. Schlueter and Michael C. Doll, owned by instant Assignee and is incorporated herein by reference in its entirety.

1. Field

The present disclosure generally relates to lock loop circuits, and more particularly, to lock loop circuits having a reduced time required to lock frequency and phase.

2. Related Art

Lock loop circuit such as phase lock loop (PLL) circuits provide an output signal having a frequency and phase that is locked to a reference signal. More specifically, PLL circuits use feedback to adjust the output signal so that the frequency and phase of the output signal match the reference signal.

As known in the art, PLL circuits are used in many applications such as radio, telecommunications, computers, and other suitable applications. For example, the circuits can be used to, among other things, generate stable frequencies, recover signals from noisy communication signals, and provide clock timing for applications requiring a stable clock.

Some mobile devices include power management systems that disable phase lock loop circuits when not in use in order to reduce power consumption and increase battery life. Since PLL circuits are used for timing in many devices, it is desirable for the circuit to quickly lock frequency and phase when the power management system re-enables the circuit.

As shown in FIG. 1, a typical PLL circuit 100 includes an error detector 102, a loop filter 104, a voltage controlled oscillator (VCO) 106, and a feedback divider 108. The loop filter 104 includes a resistor 110, a first capacitor 112, and a second capacitor 114. The resistor 110 is operatively coupled to the error detector 102 and the VCO 106 at one end and the first capacitor 112 at the other end. The first capacitor 112 is operatively coupled to the resistor 110 at one end and to ground 116 at the other end. The second capacitor 114 is operatively coupled to the error detector 102 and the VCO 106 at one end and ground 116 at the other end.

During operation, the error detector 102 provides an unfiltered VCO control voltage 116 in response to a reference frequency signal 118 and feedback frequency signal 120. More specifically, the error detector 102 adjusts the unfiltered VCO control voltage 116 to reduce a frequency and phase difference between the reference frequency signal 118 and the feedback frequency signal 120.

The loop filter 104 filters the unfiltered VCO control voltage 116 to remove any imperfections and provides a VCO control voltage 122 (e.g., a steering voltage) based thereon. The VCO 106 provides an output frequency signal 124 in response to the VCO control voltage 122. The feedback divider 108 provides the feedback frequency signal 120 in response to the output frequency signal 124.

In some embodiments, the PLL circuit 100 includes a loop precharger 126 to reduce time required for the PLL circuit 100 to lock frequency and phase. In response to a PLL enable signal 128, the loop precharger 108 provides the unfiltered VCO control voltage 116, which precharges the first and second capacitors 112, 114. In this manner, the VCO control voltage signal 122 is adjusted to a desired value faster than PLL circuits without the loop precharger 126.

Although the loop precharger 126 reduces time for the PLL circuit 100 to lock the frequency and phase of the output frequency signal 124, it is desirable to further reduce the time required to lock the frequency and phase.

In addition, the first and second capacitors 112,114 are known to leak current to ground, which increases power consumption and noise of the PLL circuit 100.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
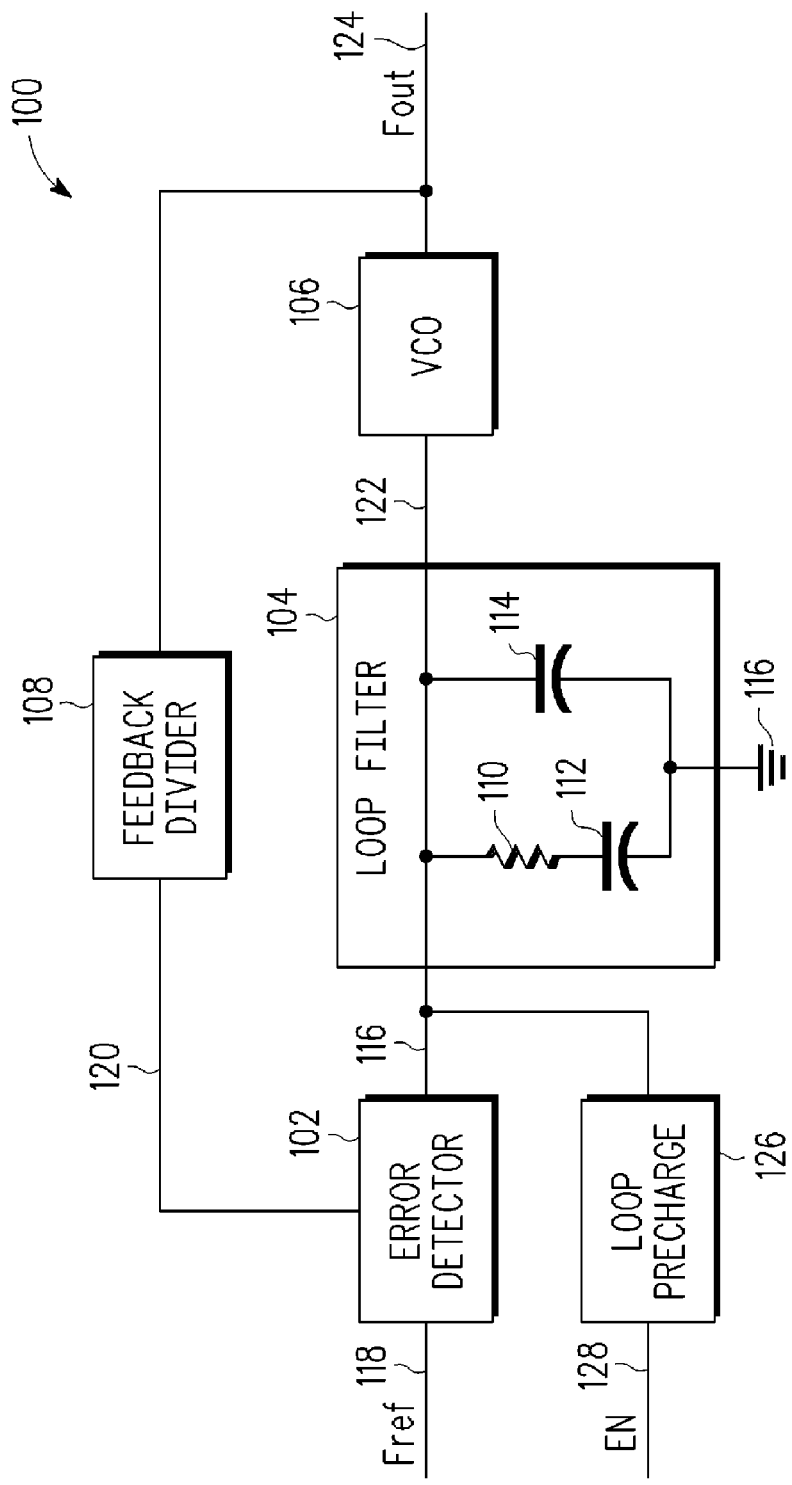
FIG. 1 is an exemplary block diagram of a prior art lock loop circuit.

In one example, a lock loop circuit includes a precharge circuit, an oscillator circuit, and a calibration circuit. The calibration circuit includes at least one register. The precharge circuit provides a precharge signal. The oscillator circuit provides an output frequency signal in response to a steering signal that is based on the precharge signal. The calibration circuit, prior to the lock loop circuit entering a disabled mode of operation, determines a calibration value for the precharge circuit based on the precharge signal and the steering signal. The calibration circuit stores the calibration value as a digital calibration value in the register. In one example, the precharge circuit provides the precharge signal based on the digital calibration value when the lock loop circuit is operating in an enabled mode of operation. A related method is also disclosed.

The circuit and method provide, among other advantages, an output signal having a frequency and phase that is locked to a reference signal faster than conventional lock loop circuits and methods. By determining and digitally storing the calibration value prior to entering the disabled mode of operation, the calibration value can be re-used to control the oscillator circuit to oscillate at substantially the same frequency when the lock loop circuit is re-enabled. In addition, the floating loop ground filter reduces leakage current to ground, which reduces power consumption and noise of the lock loop circuit. Other advantages will be recognized by those of ordinary skill in the art.

In one example, the calibration circuit includes a comparator circuit and a calibration control circuit. The comparator circuit provides a comparison signal based on the steering signal and the precharge signal. The calibration control circuit determines the calibration value by determining the digital calibration value based on the comparison signal.

In one example, the calibration circuit includes a lock detection circuit. The lock detection circuit determines whether an output frequency and phase of the output frequency signal are substantially locked to a reference frequency and phase of a reference signal. The calibration circuit determines the calibration value when the output frequency and phase are substantially locked to the reference frequency and phase.

In one example, the lock loop circuit includes a floating ground loop filter circuit. The floating ground loop filter circuit includes at least one capacitive element. The floating ground loop filter circuit provides the steering signal in response to the precharge signal. The precharge circuit controls the floating ground loop filter to bypass the capacitive element for a period of time prior to the calibration circuit determining the calibration value.

In one example, the lock loop circuit includes a synchronized feedback divider circuit. After a second period of time, the synchronized feedback divider circuit provides feedback frequency information based on the output frequency signal. The second period of time is greater than the first period of time.

In one example, a mobile device (e.g., a wireless phone, a mobile computer, a media player, and/or any other suitable mobile device which may be operative by a battery) includes a battery supply circuit, a switching converter circuit, and the lock loop circuit. The battery supply circuit provides a first voltage value. The switching converter circuit, which includes at least one switching element, converts the first voltage value into a second voltage value. The lock loop circuit provides a switching control signal to the switching element in response to the steering signal.

As used herein, the term "circuit" can include one or more processors (e.g., shared, dedicated, or group of processors such as but not limited to microprocessors, DSPs, or central processing units) and memory that execute one or more software or firmware programs, electronic circuits, integrated circuits, combinational logic circuits, FPGAs, ASICs, state machines, and/or other suitable components that provide the described functionality. In addition, the term "signal" may refer to analog or digital information.

Figure 2:
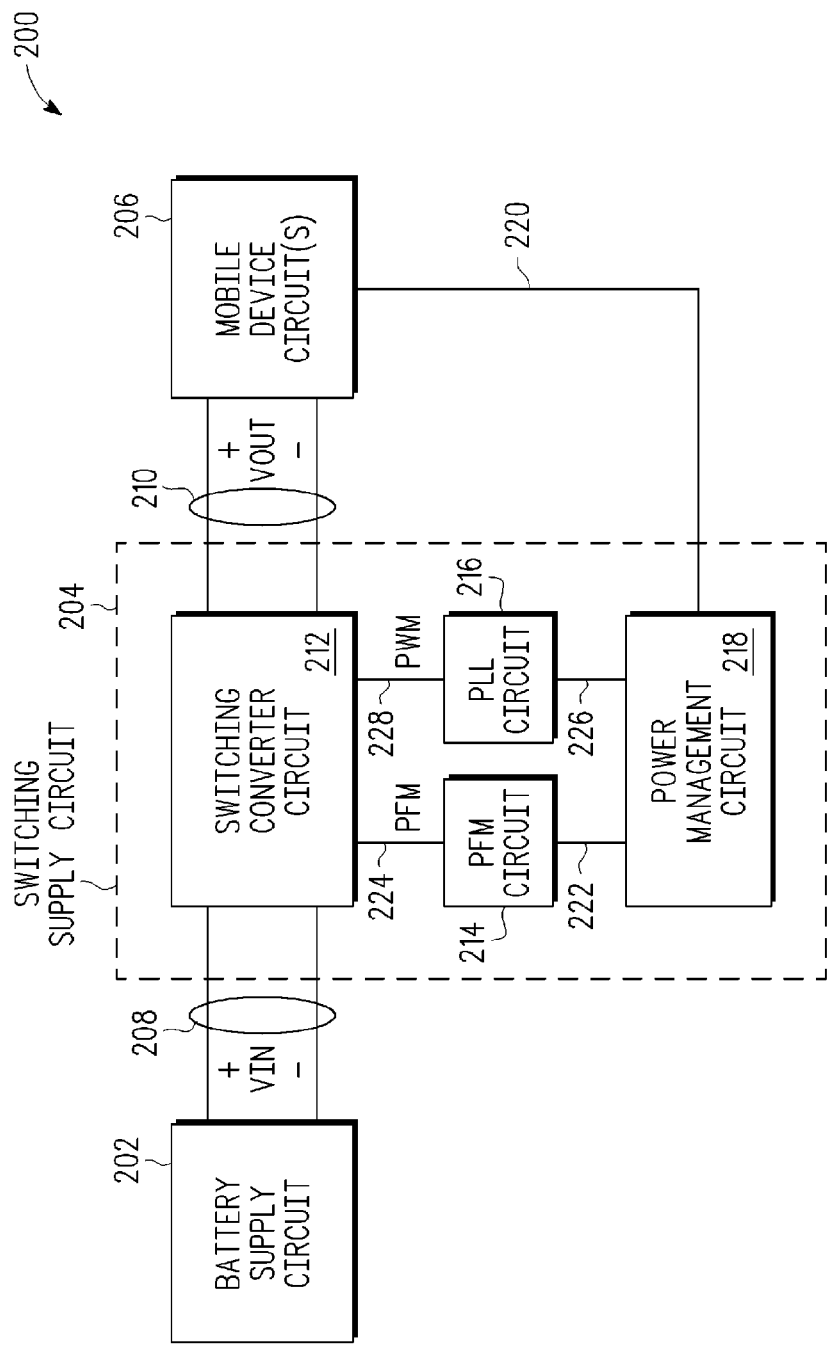
FIG. 2 is an exemplary block diagram of a mobile device using a reduced lock time lock loop circuit in accordance with one embodiment of the present disclosure.

Referring now to FIG. 2, an exemplary functional block diagram of a mobile device 200 such as a wireless phone, a mobile computer, a media player, or any other suitable mobile device that is operative by a battery supply circuit 202. The mobile device includes a switching power supply circuit 204 and other mobile device circuits 206 required to provide the desired functionality of the mobile device 200. The switching power supply circuit 204 receives a battery supply voltage 208 and provides a suitable supply voltage 210 to the other mobile device circuits 206. In some embodiments, the switching power supply circuit 204 can be a buck switching supply circuit to convert the suitable supply voltage 210 to a lower voltage value than the battery supply voltage 208. In other embodiments, the switching power supply circuit 204 can be a boost switching supply circuit to convert the suitable supply voltage 210 to a higher voltage value than the battery supply voltage 208.

The switching power supply circuit 204 includes a switching converter circuit 212, a pulse frequency modulation (PFM) circuit 214, a reduce lock time lock loop circuit 216, and a power management circuit 218. Although the lock loop circuit 216 is discussed as a phase lock loop (PLL) circuit herein, skilled artisans will appreciate that the lock loop circuit 216 can be implemented as any other suitable lock loop circuit such as, for example, a delay lock loop circuit. The power management circuit 218 monitors a load 220 of the mobile device circuits 206 and determines whether to operate the switching converter circuit 212 in a PFM mode or a pulse width modulation (PWM) mode based on the load 220. In some embodiments, the power management circuit 218 provides a PFM enable signal 222 when the load is operating in at light load condition such as, for example, less than or equal to 50 mA. In response to the PFM enable signal 222, the PFM circuit 214 provides a PFM control signal 224 to the switching converter circuit 212, which controls internal switching of the circuit as known in the art.

In addition, in some embodiments, the power management circuit 218 provides a lock loop enable signal 226 when the load is operating at a load greater than the light load, such as, for example, (e.g., greater than or equal to 50 mA) so that the switching converter circuit 212 can operate in the PWM mode. In response to the lock loop enable signal 226, the lock loop circuit 216 provides a control signal 228 (e.g., a PWM control signal) having a stable frequency and phase to the switching converter circuit 212, which controls internal switching of the circuit as known in the art. As will be discussed in more detail, the lock loop circuit 216 requires less time to lock frequency and phase than some known lock loop circuits. As such, the lock loop circuit 216 can provide the control signal 228 having a stable frequency and phase faster than some known lock loop circuits.

Although, the reduced lock time lock loop circuit 216 is used to control switching of a switching converter circuit in this example, skilled artisans will appreciate that the lock loop circuit 216 can be used in any application where a signal having a stable frequency and phase is desired.

Figure 3:
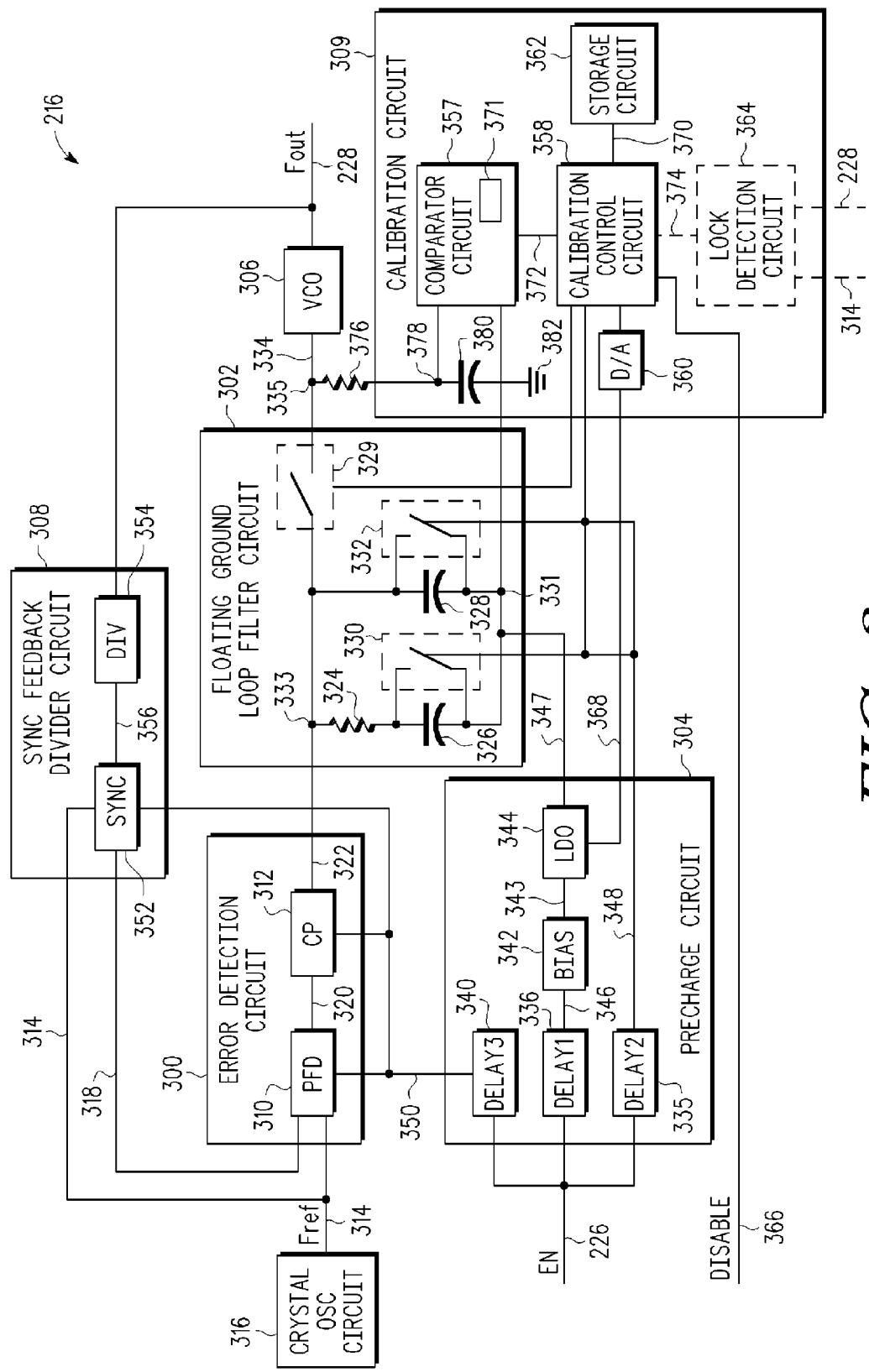
FIG. 3 is an exemplary block diagram of the reduced lock time lock loop circuit.

Referring now to FIG. 3, the lock loop circuit 216 includes an error detection circuit 300, a floating ground loop filter circuit 302, a precharge circuit 304, a controllable oscillator circuit 306, a synchronized feedback divider circuit 308, and a calibration circuit 309. The error detection circuit 300 is operatively coupled to the floating ground loop filter circuit 302, the synchronized feedback divider circuit 308, and the precharge circuit 304. The controllable oscillator circuit 306 is operatively coupled to the synchronized feedback divider circuit 308, the floating ground loop filter circuit 302, and the calibration circuit 309. The floating ground loop filter circuit 302 is operatively coupled to the error detection circuit 300, the controllable oscillator circuit 306, the precharge circuit 304, and the calibration circuit 309. As shown, the floating ground loop filter circuit 302 is not coupled to ground 116 like the loop filter 104 depicted in FIG. 1. Therefore, the floating ground loop filter circuit 302 has a floating (or virtual) ground unlike the loop filter 104 in FIG. 1.

The error detection circuit 300 includes a phase-frequency detection (PFD) circuit 310 and a charge pump circuit 312. The PFD circuit 310 compares a reference frequency signal 314, which can be provided by a crystal oscillator circuit 316 for example, to a feedback frequency signal 318. The PFD circuit 310 provides error information 320 based on a difference (e.g., frequency and phase difference) between the reference frequency signal 314 and the feedback frequency signal 318. The charge pump circuit 312 provides a unfiltered oscillator control signal 322 in response to the error information 320. In some embodiments, the unfiltered oscillator control signal 322 is proportional to the error information 320.

The floating ground loop filter circuit 302 includes a first resistive element 324 (e.g., a resistor), a first capacitive element 326 (e.g., a capacitor), a second capacitive element 328 (e.g., a capacitor), a signal sample switch circuit 329, a first bypass switch circuit 330, and a second bypass switch circuit 332. The first resistive element 324 and the first capacitive element 326 are operatively coupled in series between node 331 and node 333. The second capacitive element 328 is operatively coupled in parallel to the first resistive element 324 and the first capacitive element 326. The first bypass switch circuit 330 is operatively coupled in parallel to the first capacitive element 326. The second bypass switch circuit 332 is operatively coupled in parallel to the second capacitive element 328. The signal sample switch 331 is operatively coupled between node 333 and node 335.

The precharge circuit 304 selectively controls the bypass switch circuits 330, 332 to bypass the respective capacitive element 326, 328 in order to provide an osteering signal 334 (e.g., an oscillator control signal) faster than known lock loop circuits 100. More specifically, the precharge circuit 304 provides a precharge signal 347 and controls the floating ground loop filter 302 to bypass the capacitive elements 326, 328 in response to the enable signal 226. In response to the precharge signal 347, the floating ground loop filter circuit 302 provides a steering signal 334 (e.g., an oscillator control signal) for the controllable oscillator circuit 306. In addition, the calibration circuit 309 selectively controls the bypass switch circuits 330, 332 and the signal sample switch circuit 329 in order to determine a calibration value for the precharge circuit prior to the lock loop circuit 216 entering a disabled mode of operation.

The precharge circuit 304 includes a first delay circuit 336, a second delay circuit 338, a third delay circuit 340, a bias circuit 342, and a voltage regulator circuit 344. The bias circuit 342 provides a bias signal 343 (e.g., a bias current) to the voltage regulator circuit 344 as known in the art. The voltage regulator circuit 344 can be any known voltage regulator circuit such as, for example, a low dropout (LDO) regulator circuit or other suitable regulator circuit. The voltage regulator circuit 344 provides a precharge signal 347 in response to the bias signal 343.

In response to the enable signal 226, the first delay circuit 336 provides a voltage regulator enable signal 346, the second delay circuit 338 provides a capacitive element bypass signal 348, and the third delay circuit 340 provides an error detection enable signal 350. More specifically, the first delay circuit 366 provides the voltage regulator enable signal 346 after a first period of time, the second delay circuit 338 provides the capacitive element bypass signal 348 for a second period of time, and the third delay circuit 340 provides the error detection enable signal 350 after a third period of time. In some embodiments, the third period of time can be greater than the second period of time, which can be greater than the first period of time. In addition, the first, second, and third periods of time can be predetermined. For example, the first period of time can be 0.690 μs, the second period of time can be 3.75 μs, and the third period of time can be 4.25 μs, although other period of times are contemplated.

As such, when the lock loop circuit 216 is enabled, the switch circuits 330, 332 initially bypass the respective capacitive elements 326, 328 for the second period of time, which allows the steering signal 334 to rise quicker since the capacitors 326, 328 do not need to be charged and are not coupled to ground. After the second period of time, the bypass switch circuits 326, 328 are disabled allowing the floating ground loop filter circuit 302 to filter the unfiltered oscillator control signal 322 to remove any imperfections.

The synchronized feedback divider circuit 308 includes a synchronization circuit 352 and a divider circuit 354. The synchronization circuit 352 provides the feedback frequency signal 318 in response to the error detection enable signal 350 and the reference frequency signal 314. More specifically, the synchronization circuit 352 provides the feedback frequency signal 318 in response to the error detection enable signal 350 and after a desired edge of the reference frequency signal 314. In some embodiments, the desired edge can be a first rising edge of reference frequency signal 314 after the error detection enable signal 350 is provided.

The feedback frequency signal 318 is based on an initial feedback frequency signal 356. The divider circuit 354 provides the initial feedback frequency signal 356 by dividing (or in some cases multiplying) the output frequency signal 124 by a determined value such as 128 or other suitable value.

The calibration circuit 309 includes a comparator circuit 357, a calibration control circuit 358, a digital to analog converter (DAC) circuit 360, a storage circuit 362 such as a register circuit, a memory circuit, or other suitable storage circuit capable of storing a digital value. In some embodiments, the calibration circuit 309 also includes a phase lock detection circuit 364.

A second resistive element 376 (e.g., a resistor) is operatively coupled between node 335 and node 378. The second resistive element 376 isolates the comparator circuit 357 from the floating ground loop filter 302 and suppresses transient noise. A third capacitive element 380 (e.g., a capacitor) is operatively coupled between node 378 and ground 382. The third capacitive element 380 stores a voltage value of the steering signal 334 for use by the comparator circuit 357.

In response to assertion of a lock loop disable signal 366 (either assertion high or low), the calibration circuit 309 enters a calibration mode to determine a calibration value 368 for the voltage regulator circuit 344 prior to the lock loop circuit 216 entering a disabled mode of operation. The calibration control circuit 358 stores the calibration value 368 as a digital calibration value 370 (e.g., a 14 bit digital value) in the storage circuit 362. By digitally storing the calibration value 368 in the storage circuit 362, the lock loop circuit 216 can be disabled for long periods of time without losing the calibration value 368.

When the lock loop circuit 216 is later re-enabled, the digital calibration value 370 is converted via the DAC circuit 360 to provide the calibration value 368 to the precharge circuit 304. In this manner, the precharge circuit 304 can provide the precharge signal 347 based on the calibration value 368 so that the control signal 228 provided by the oscillator circuit 306 is substantially at the same frequency as the reference frequency signal 314.

During calibration, the calibration control circuit 358 opens the signal sample switch circuit 329 in response to assertion of the lock loop disable signal 366 (or in some cases an absence of the lock loop enable signal 226). The comparator circuit 357 samples and holds (e.g., stores) the steering signal 334 via node 378 in a sample hold circuit 371. The sample hold circuit 371 can be employed using any known technique to temporarily store a value. For example, the sample hold circuit can comprise an analog t-gate, a resistor, and capacitor as known in the art. In some embodiments, the sample hold circuit 371 can be eliminated and the comparator circuit 357 can used the voltage value stored in the third capacitive element 380.

Once the steering signal 334 is stored via the sample hold circuit 371, the calibration control circuit 358 controls the bypass switch circuits 330, 332 to bypass captive elements 326, 328, respectively. The comparator circuit 357 compares the stored steering signal 334 to the precharge signal 347 and provides a comparison signal 372 based thereon to determine. The calibration control module 358 selectively adjusts the calibration value 368 until the comparison signal 372 indicates that the stored steering signal 334 and the precharge signal 347 are substantially equal. The calibration control module 358 can use any known search algorithm such as, for example, a binary search, a linear search, or any other suitable search algorithm to adjust the calibration value 368.

When the comparison signal 372 indicates that the steering signal 334 and the precharge signal 347 are substantially equal, the calibration control circuit 358 stores the calibration value 368 as the digital calibration value 370 in the storage circuit 362. Once the digital calibration value 370 has been stored, the lock loop circuit 216 can enter the disabled mode of operation.

In embodiments that include the phase lock detection circuit 364, the calibration control circuit 358 determines the calibration value 368 in response to a phase lock detected signal 374. More specifically, the phase lock detection circuit 364 determines whether the frequency and phase of the control signal 228 are substantially locked to the frequency and phase of the reference signal 314 and provides the phase lock detected signal 374 based thereon. If the control signal 228 and the reference signal 314 are substantially locked, the calibration control circuit 358 can determine the calibration value 368. However, if the control signal 228 and the reference signal 314 are not substantially locked, the calibration control circuit 358 can wait until the phase lock detection circuit 364 indicates that the control signal 228 and the reference signal 314 are substantially locked to determine the calibration value 368. In other embodiments, the calibration control circuit 358 can skip the process of determining the calibration value 368 when the control signal 228 and the reference signal 314 are not substantially locked since the calibration value 368 would not be based on a proper frequency and/or phase of the reference signal 314.

Figure 4:
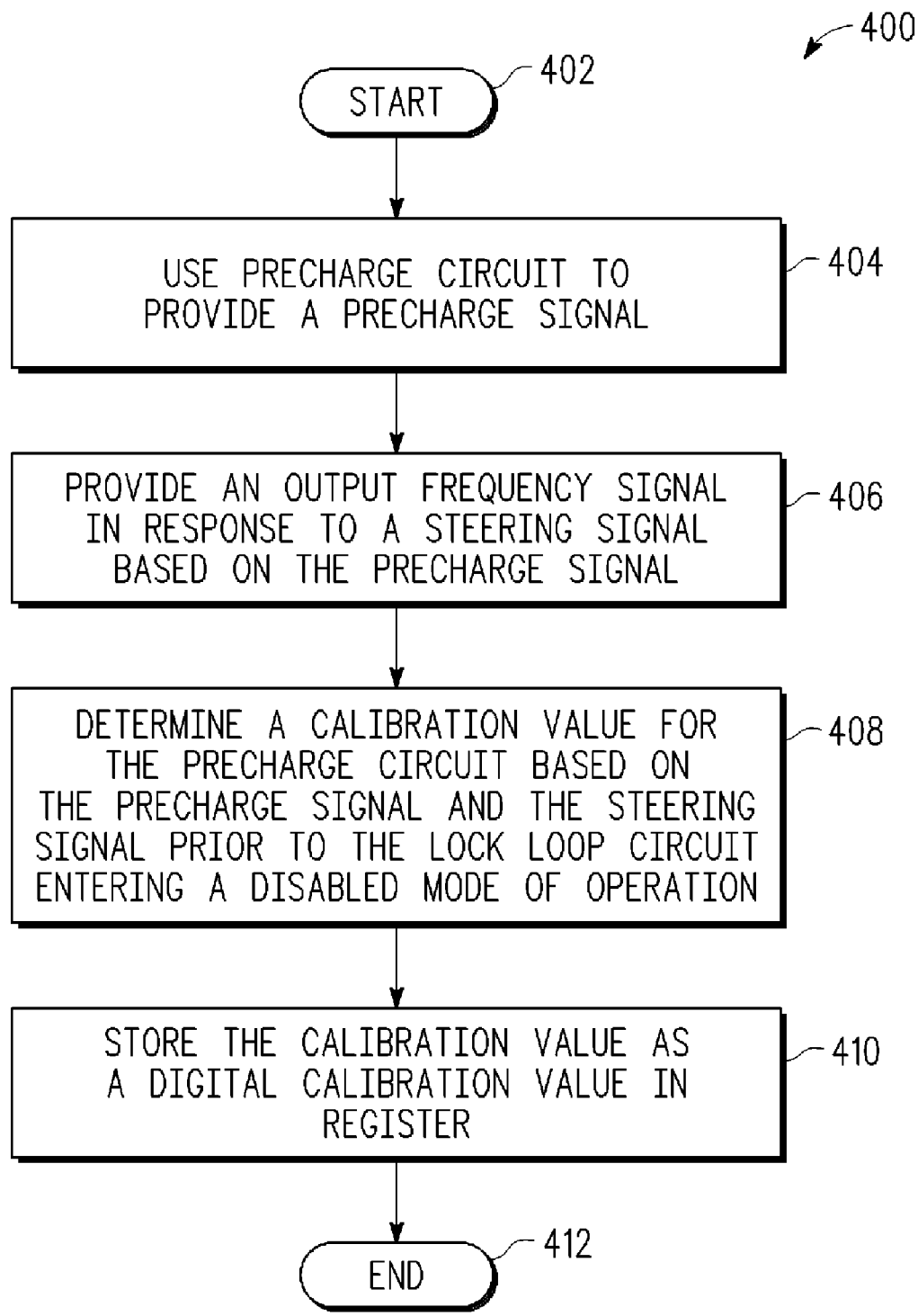
FIG. 4 is a flowchart depicting exemplary steps that can be taken by the reduced lock time lock loop circuit to determine a calibration value for a precharge circuit.

Referring now to FIG. 4, exemplary steps that can be taken by the lock loop circuit 216 when determining the calibration value 368 are generally identified at 400. The process starts in step 402 when the lock loop circuit 216 receives the lock loop disable signal 366 (or in some cases ceases to receive the lock loop enable 226 signal). In step 404, the lock loop circuit 216 provides the precharge signal 347 using the precharge circuit 304. As previously noted, the steering signal 334 is based on the precharge signal 347.

In step 406, the oscillator circuit 306 provides the control signal 228 in response to the steering signal 334, which is based on the precharge signal 347. As previously noted, the steering signal 334 is corrected by the error detection circuit 300 in response to the control signal 228 and the reference frequency signal 314 so that the frequency and phase of the control signal 228 are locked to the frequency and phase of the reference frequency signal 314.

In step 408, the calibration circuit 309 determines the calibration value 368 for the precharge circuit 304 based on the stored steering signal 334 and the precharge signal 347 prior to the lock loop circuit 216 entering a disable mode of operation. In some embodiments, the calibration value 368 can be determined in response to a calibration signal (not shown) received by the lock loop circuit 216. In these embodiment, the lock loop circuit 216 would not enter the disabled mode of operation after determining the calibration value 368. In step 410, the calibration circuit 309 stores the calibration value 368 as the digital calibration value 370 in the storage circuit 362. The process ends in step 412.

Figure 5:
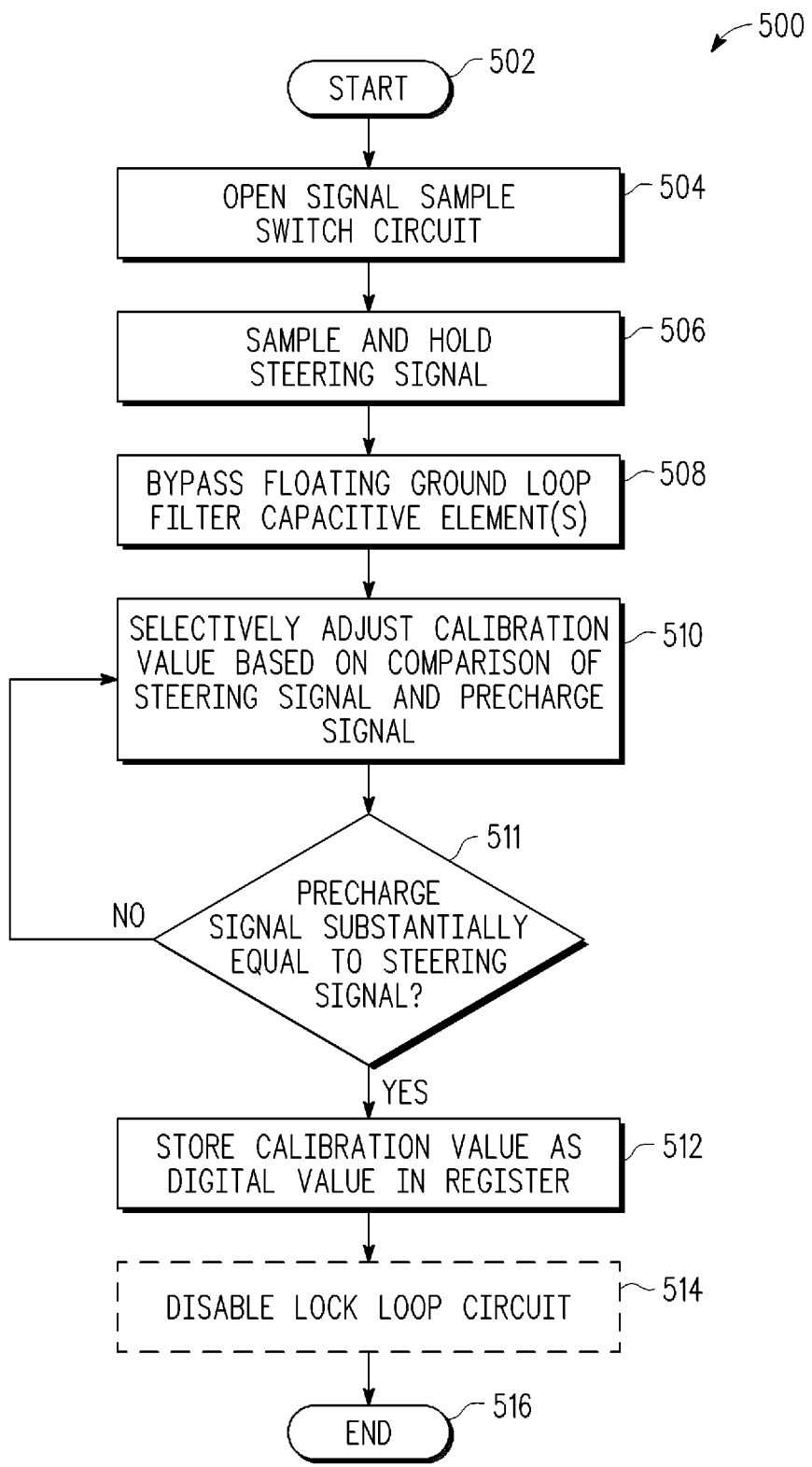
FIG. 5 is a flowchart depicting exemplary steps that can be taken by a calibration circuit of the reduced lock time lock loop circuit to determine the calibration value.

Referring now to FIG. 5, exemplary steps that can be taken by the calibration circuit 309 when determining the calibration value 368 are generally identified at 500. The process starts in step 502 when the calibration control circuit 358 receives the lock loop disable signal 366 or any other suitable signal such as a calibration signal (not shown) for example. In addition, the process can start due to an absence of the lock loop enable signal 226. In embodiments that include the phase lock detection circuit 364, the process verifies whether phase and frequency of the control signal 228 is locked to the phase and frequency of reference frequency signal 314 prior to starting.

In step 504, the calibration control circuit 358 controls the signal sample switch circuit 329 to open creating an open circuit between the floating ground loop filter circuit 302 and the oscillator circuit 306. In step 506, the comparator circuit 357 samples the steering signal 334 and holds (e.g., stores) the steering signal 334 in the sample hold circuit 371 (or the third capacitive element 380). In step 508, the calibration control circuit 358 controls the bypass switch circuits 330, 332 to bypass the capacitive elements 326, 328, respectively. In step 510, the calibration control circuit 358 selectively adjusts the calibration value 368 using any known search technique.

In step 511, the comparator circuit 357 determines whether the precharge signal 347 is substantially equal to the steering signal 334. If the precharge signal 347 is not substantially equal to the steering signal 334, the process returns to step 510. However, if the comparator circuit 357 determines that the precharge signal 347 is substantially equal to the steering signal 334, the calibration control circuit 358 stores the calibration value 368 as the digital calibration value 370 in the storage circuit 362 in step 512.

In embodiments that determine the calibration value 368 in response to lock loop disable signal 366 (or in some cases the absence of the lock loop enable signal 226), the calibration control circuit 358 allows the lock loop circuit 216 to enter the disabled mode of operation in step 514 and the process ends in step 516. However, in embodiments that determine the calibration value 368 in response to a calibration signal, the process ends in step 516.

As noted above, among other advantages, the lock loop circuit 216 provides the output signal 228 having a frequency and phase that is locked to the reference signal 314 faster than conventional lock loop circuits. By determining and digitally storing the calibration value 368 prior to entering the disabled mode of operation, the calibration value 368 can be re-used to control the oscillator circuit 306 to oscillate at substantially the same frequency when the lock loop circuit 216 is re-enabled. In addition, the floating loop ground filter 302 reduces leakage current to ground, which reduces power consumption and noise of the lock loop circuit. Other advantages will be recognized by those of ordinary skill in the art.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. In addition, unless stated otherwise, terms such as "first" and "second" are used to arbitrarily distinguish between the elements such terms describe. Thus, these terms are not necessarily intended to indicate temporal or other prioritization of such elements.

What is claimed is:

1. A lock loop circuit, comprising:
   a precharge circuit that is operative to provide a precharge signal;
   an oscillator circuit that is operative to provide an output frequency signal in response to a steering signal that is based on the precharge signal;
   a calibration circuit, having at least one register, the calibration circuit being operative to, prior to the lock loop circuit entering a disabled mode of operation, determine a calibration value for the precharge circuit based on the precharge signal and the steering signal and to store the calibration value as a digital calibration value in the register; and a floating ground loop filter circuit, including at least one capacitive element, that is operative to provide the steering signal in response to the precharge signal, wherein the precharge circuit is operative to control the floating ground loop filter to bypass the at least one capacitive element for a period of time prior to the calibration circuit determining the calibration value.

2. The lock loop circuit of claim 1 wherein the precharge circuit is operative to provide the precharge signal based on the digital calibration value.

3. The lock loop circuit of claim 1 wherein the calibration circuit comprises:
a comparator circuit that is operative to provide a comparison signal based on the steering signal and the precharge signal; and
a calibration control circuit that is operative to determine the calibration value by determining the digital calibration value based on the comparison signal.

4. The lock loop circuit of claim 3 wherein the calibration circuit comprises a lock detection circuit that is operative to determine whether an output frequency and phase of the output frequency signal are substantially locked to a reference frequency and phase of a reference signal, wherein the calibration circuit is operative to determine the calibration value when the output frequency and phase are substantially locked to the reference frequency and phase.

5. The lock loop circuit of claim 1 further comprising a synchronized feedback divider circuit that is operative to, after a second period of time, provide feedback frequency information based on the output frequency signal, wherein the second period of time is greater than the period of time.

6. The lock loop circuit of claim 1 wherein the floating ground loop filter circuit further comprises at least one bypass switch circuit operatively coupled in parallel to the at least one capacitive element, wherein the at least one bypass switch circuit is operative to bypass a plurality of capacitive elements in response to a bypass control signal received from the precharge circuit.

7. A method of operating a lock loop circuit, comprising:
providing, with a precharge circuit, a precharge signal;
providing an output frequency signal in response to a steering signal wherein the steering signal is based on the precharge signal;
determining a calibration value for the precharge circuit based on the precharge signal and the steering signal prior to the lock loop circuit entering a disabled mode of operation;
storing the calibration value as a digital calibration value; and
bypassing at least one capacitive element of a floating ground loop filter circuit that is operative to provide the steering signal for a period of time prior to the calibration circuit determining the digital calibration value.

8. The method of claim 7 further comprising providing the precharge signal based on the digital calibration value during an enabled mode of operation.

9. The method of claim 7 further comprising:
providing a comparison signal based on the steering signal and the precharge signal; and
determining the calibration value based on the comparison signal.

10. The method of claim 9 further comprising:
determining whether an output frequency and phase of the output frequency signal are substantially locked to a reference frequency and phase of a reference signal; and
determining the calibration value when the output frequency and phase are substantially locked to the reference frequency and phase.

11. The method of claim 7 further comprising providing, after a second period of time, feedback frequency information based on the output frequency signal, wherein the second period of time is greater than the period of time.

12. A mobile device, comprising:
a battery supply circuit that is operative to provide a first voltage value;
a switching converter circuit, including at least one switching element, that is operative to convert the first voltage value into a second voltage value; and
a lock loop circuit that comprises:
a precharge circuit that is operative to provide a precharge signal;
an oscillator circuit that is operative to provide an output frequency signal in response to a steering signal that is based on the precharge signal;
a calibration circuit, having at least one register, the calibration circuit being operative to, prior to the lock loop entering a disabled mode of operation, determine a calibration value for the precharge circuit based on the precharge signal and the steering signal and to store the calibration value as a digital calibration value in the register; and
a floating ground loop filter circuit, including at least one capacitive element, that is operative to provide the steering signal in response to the precharge signal, wherein the precharge circuit is operative to control the floating ground loop filter to bypass the at least one capacitive element for a period of time prior to the calibration circuit determining the calibration value.

13. The mobile device of claim 12 wherein the precharge circuit is operative to provide the precharge signal based on the digital calibration value when the lock loop circuit is operating in an enabled mode of operation.

14. The mobile device of claim 12 wherein the calibration circuit comprises:
a comparator circuit that is operative to provide a comparison signal based on the steering signal and the precharge signal; and
a calibration control circuit that is operative to determine the calibration value by determining the digital calibration value based on the comparison signal.

15. The mobile device of claim 14 wherein the calibration circuit further comprises a lock detection circuit that is operative to determine whether an output frequency and phase of the output frequency signal are substantially locked to a reference frequency and phase of a reference signal, wherein the calibration circuit is operative to determine the calibration value when the output frequency and phase are substantially locked to the reference frequency and phase.

16. The mobile device of claim 12 wherein the lock loop circuit further comprises a synchronized feedback divider circuit that is operative to, after a second period of time, provide feedback frequency information based on the output frequency signal, wherein the second period of time is greater than the period of time.

17. The mobile device of claim 12 wherein the floating ground loop filter circuit further comprises at least one bypass switch circuit operatively coupled in parallel to the at least one capacitive element, wherein the at least one bypass switch circuit is operative to bypass a plurality of capacitive elements in response to a bypass control signal received from the precharge circuit.

* * * * *